(12) United States Patent
Shibayama

(10) Patent No.: US 7,230,247 B2
(45) Date of Patent: Jun. 12, 2007

(54) DETECTOR

(75) Inventor: Katsumi Shibayama, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 100 days.

(21) Appl. No.: 10/383,252

(22) Filed: Mar. 7, 2003

(65) Prior Publication Data

US 2003/0218120 A1 Nov. 27, 2003

Related U.S. Application Data

(60) Provisional application No. 60/430,660, filed on Dec. 4, 2002.

(30) Foreign Application Priority Data

Mar. 8, 2002 (JP) .......................... P2002-064227

(51) Int. Cl.
*H01L 31/02* (2006.01)
(52) U.S. Cl. .................................... 250/370.11; 378/19
(58) Field of Classification Search ........... 250/370.11; 378/19
See application file for complete search history.

(56) References Cited

U.S. PATENT DOCUMENTS

| | | | |
|---|---|---|---|
| 3,748,546 A * | 7/1973 | Allison ....................... 257/435 |
| 5,043,582 A | 8/1991 | Cox et al. .............. 250/370.09 |
| 5,245,191 A | 9/1993 | Barber et al. .......... 250/363.04 |
| 5,262,649 A * | 11/1993 | Antonuk et al. ....... 250/370.09 |
| 5,315,147 A | 5/1994 | Solomon .................... 257/448 |
| 5,464,984 A | 11/1995 | Cox et al. .............. 250/370.11 |
| 5,477,933 A | 12/1995 | Nguyen ....................... 174/262 |
| 6,050,832 A | 4/2000 | Lee et al. ..................... 439/91 |
| 6,137,164 A | 10/2000 | Yew et al. .................. 257/686 |
| 6,510,195 B1 * | 1/2003 | Chappo et al. ............... 378/19 |
| 2003/0025132 A1 * | 2/2003 | Tobey ........................ 257/202 |

FOREIGN PATENT DOCUMENTS

| | | |
|---|---|---|
| EP | 0 926 931 A1 | 6/1999 |
| EP | 1 589 581 A1 | 10/2005 |
| JP | 04-035474 | 2/1992 |

(Continued)

*Primary Examiner*—David Porta
*Assistant Examiner*—Shun Lee
(74) *Attorney, Agent, or Firm*—Drinker Biddle & Reath LLP

(57) ABSTRACT

A semiconductor chip S is formed with a plurality of photodiodes PD and comprises a plurality of output terminals T of the photodetector elements provided on the surface thereof. The circuit substrate C comprises a plurality of input terminals I to which signals from the output terminals T of the semiconductor chip S are input. The connecting means CM connects the respective output terminals T to respective input terminals I, and the interval between the input terminals I is set to a smaller dimension than the interval between the output terminals T. In this detector, since the signal reading circuit A is formed on the circuit substrate C in a region outside the region $R_1$ where the input terminals are formed, it is possible to make the dimensions of the circuit substrate C smaller than those of the semiconductor chip S, and consequently, when a plurality of detectors D are arranged together, the respective semiconductor chips S can be positioned in mutually proximate or contacting fashion, and hence any decline in image resolution in the connecting section of the detectors can be suppressed.

62 Claims, 12 Drawing Sheets

FOREIGN PATENT DOCUMENTS

| | | |
|---|---|---|
| JP | 4-254377 | 9/1992 |
| JP | 5-90554 | 4/1993 |
| JP | 05-268535 | 10/1993 |
| JP | 7-333348 | 12/1995 |
| JP | H08-330469 | 12/1996 |
| JP | 9-288184 | 11/1997 |
| JP | 2001-339057 | 12/2001 |
| WO | WO 03/077318 A1 | 9/2003 |

* cited by examiner

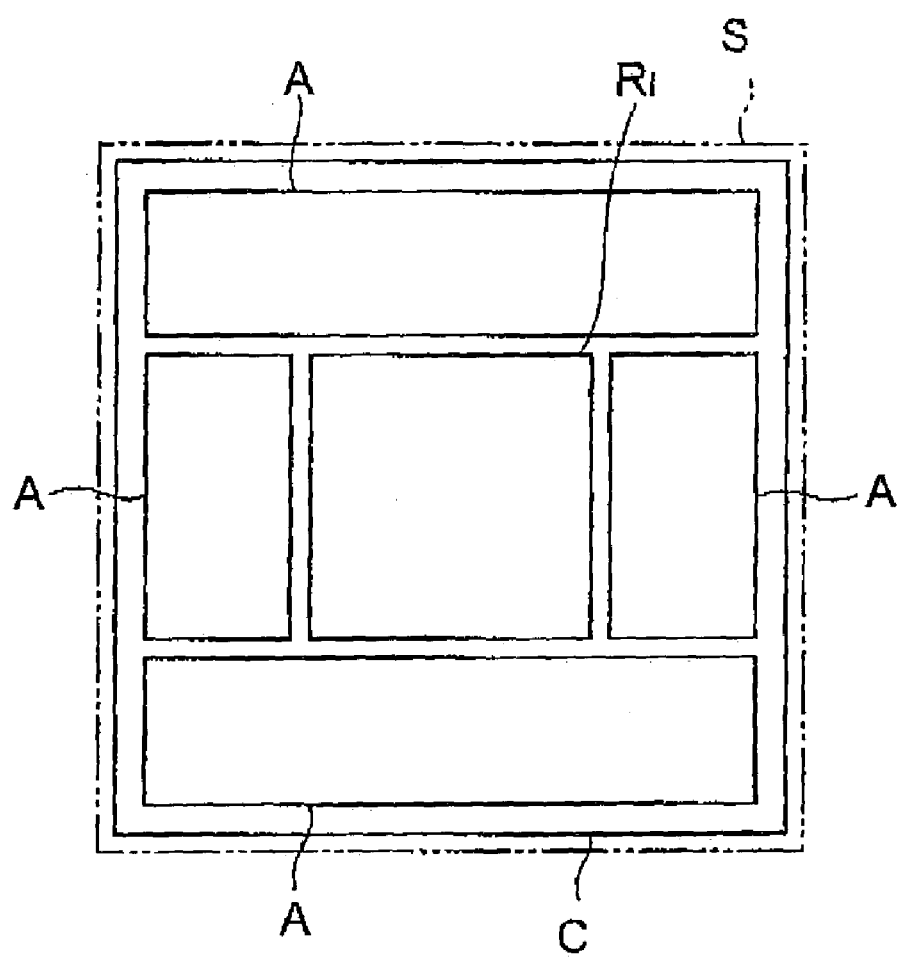

DETECTOR

This application claims benefit from provisional application 60/430,660 filed on Dec. 4, 2002.

BACKGROUND OF THE INVENTION

1. Field of the Invention

The present invention relates to a detector for use in an X-ray imaging device, or the like.

2. Related Background Art

A conventional detector which can be used in an X-ray imaging device is described in the following references:

(1) Japanese Patent Laid-open No. (Hei)4-254377

This reference discloses an installation structure for an optical detector. In this installation structure, a back-illuminated photodiode array is connected via a pump to a signal processing section. Since the optical signal sampling electrodes are provided on the back face of the photoreceptor substrate, it is possible to use virtually all of the surface of the substrate as a light receiving face, and hence the aperture ratio is improved greatly compared to a conventional device. Moreover, the photoreceptor section uses a PIN type photodiode, the light incident via the I layer is absorbed with high efficiency, the junction capacitance can be reduced due to presence of the I layer, the depletion layer travel time of the carrier can be shortened by applying a high voltage, and the mechanical strength can be increased. The signal charge extracted from each pixel is input to a signal processing circuit substrate.

(2) Japanese Patent Laid-open No. (Hei)9-288184

This reference discloses a radiation detection device which adopts a layered structure for the light detecting section, wiring substrate, drive integrated circuit and signal processing integrated circuit, in order to protect the integrated circuits from radiation.

(3) Japanese Patent Laid-open No. (Hei)7-333348

This reference discloses an X-ray CT (Computer Tomography) device. Since the X-ray CT device emits the output of a photodiode array via a pump formed on the opposite side to the side on which the X-rays are incident, it permits the respective radiation detector elements to be arranged in a highly dense fashion in the two-dimensional direction, without reducing the detection sensitivity of the radiation detector elements, and therefore allows a broad range of X-ray data to be obtained in a single X-ray irradiation operation.

(4) Japanese Patent Laid-open No. (Hei)5-90554

This reference discloses a detector wherein the output of an HgCdTe photodiode array is connected via a pump in order to be read by an Si-CCD. The drive voltage from the DC power source driving the photodiode array is applied via the wiring on the Si-CCD. In other words, the surface on the Si-CCD side is formed with a dual wiring structure, a first wiring system being used to supply the output of the respective photodiodes to respective pixels (read-out regions) of the CCD via a pump, and the second wiring system forming wiring for supplying a voltage from the DC power source to a photodiode array.

SUMMARY OF THE INVENTION

However, in the case of any of these detectors, the supporting substrate is larger than the semiconductor chip, and therefore it is not possible to dispose a plurality of detectors in a mutually adjacent fashion, such that there is no gap therebetween. Of course, if the supporting substrate is made smaller and the circuits are positioned to the side, then it is possible to dispose the detectors in a two row and two column matrix, but in the case of a three row and three column matrix, for example, there is no space to extract the output from the centrally positioned detector.

The present invention was devised with the foregoing problems in view, an object thereof being to provide a detector which allows respective semiconductor chips to be placed in extremely proximate fashion or mutually contacting fashion, when a plurality of detectors are arranged together.

In order to achieve the aforementioned object, the detector relating to the present invention is a detector comprising a semiconductor chip formed with a plurality of photodetector elements and provided with a plurality of output terminals of the photodetector elements on the surface thereof, a circuit substrate provided with a plurality of input terminals to which signals from the output terminals are input, and connecting means for connecting the respective output terminals to the respective input terminals; wherein the interval between the input terminals is set to a smaller dimension than the interval between the output terminals; and the circuit substrate comprises a signal reading circuit for reading out signals from the input terminals, provided in a region outside the region in which the input terminals are formed.

According to this detector, since the interval between the input terminals of the circuit substrate is set to a smaller dimension than the interval between the output terminals, and a signal reading circuit is formed on the circuit substrate in a region outside the region where the input terminals are formed, it is possible to reduce the dimensions of the circuit substrate below those of the semiconductor chip, and consequently, when a plurality of detectors are arranged together, it is possible to position the semiconductor chips in a mutually proximate or mutually contacting fashion. Therefore, the blind area become small because the gap between pixel (photodiode) groups are extremely small, one of the pixel group being positioned at outermost periphery of one semiconductor chip and the other pixel group being positioned at outermost periphery of the other semiconductor chip. So, it is possible to pickup large images.

Moreover, the connecting means may also provide a connection of the outputs of the circuit substrate to external leads, and a connection from external leads to the inputs of the circuit substrate, in which case the circuit structure can be simplified.

Furthermore, the connecting means may also constitute a supporting substrate for the semiconductor chip. In other words, by means of the connecting means supporting the semiconductor chip, it is possible to increase the mechanical strength of the detector.

Furthermore, the supporting substrate may have a depression for accommodating the circuit substrate, in which case the circuit substrate is protected by the supporting substrate.

Moreover, the connecting means may be formed by burying metal wiring inside a ceramic base member, the metal wiring being electrically connected to the output terminals of the semiconductor chip and the input terminals of the circuit substrate. Since ceramic has excellent insulating properties, it is possible to isolate the metal wires electrically by means of the ceramic base member, and hence a multiple-layer wiring structure can be formed inside the base member.

Furthermore, the detector according to the present invention may also comprise a scintillator formed on the light receiving side of the semiconductor chip. A scintillator generates fluorescence in response to the incidence of radiation, such as X rays, or the like. This fluorescence can be detected by the semiconductor chip.

Moreover, the connecting means may also be constituted by a multiple-layer wiring substrate, the output terminals of the semiconductor chip and one face of the multiple-layer wiring substrate being connected by means of bumps, and the other face of the multiple-layer wiring substrate and the input terminals of the circuit substrate being connected by means of bumps. In this case, since it is possible to form the semiconductor chip, multiple-layer wiring substrate, and circuit substrate independently, manufacturing yield can be improved, in addition to which, the overall thickness of the device can be reduced by using a relatively thin multiple-layer wiring substrate.

Furthermore, the connecting means may be constituted by thin film multiple-layer wiring formed on one face of the semiconductor chip, the terminals facing to the circuit substrate and provided on the thin film multiple-layer wiring and the input terminals of the circuit substrate being connected by means of bumps. The thin film multiple-layer wiring has a very small thickness, the overall thickness can be reduced significantly.

Moreover, the detector according to the present invention is a detector comprising a semiconductor chip on which a plurality of photodetector elements are formed, a circuit substrate to which output signal from the semiconductor chip are input, and a supporting substrate for supporting the semiconductor chip and the circuit substrate, wherein the dimensions of the supporting substrate in the directions perpendicular to the thickness direction thereof are equal to or less than the dimensions of the semiconductor chip in the directions perpendicular to the thickness direction thereof.

In other words, in this detector, since the dimension of the supporting substrate is equal to or smaller than the dimension of the semiconductor chip, this dimension being along the perpendicular direction to the thickness of the supporting substrate, it is possible to arrange a plurality of semiconductor chips in an extremely proximate or mutually contacting fashion. The circuit substrate is a substrate on which a signal reading circuit is formed.

Moreover, if this supporting substrate constitutes a portion of a package for accommodating the circuit substrate, then the circuit substrate is protected by the package.

Furthermore, in this case, the dimensions of the circuit substrate in the directions perpendicular to the thickness direction thereof are less than the dimensions of the semiconductor chip in the directions perpendicular to the thickness direction thereof.

In other words, the detector according to the present invention comprises a semiconductor chip formed with a plurality of photodetector elements, and a circuit substrate to which all the output signals of the semiconductor chip are input, wherein the dimensions of the circuit substrate in the directions perpendicular to the thickness direction thereof are less than the dimensions of the semiconductor chip in the directions perpendicular to the thickness direction thereof. Since the circuit substrate to which all the output signals from the semiconductor chip is small, it is possible to arrange the plurality of semiconductor chips in an extremely proximate or mutually contacting fashion.

BRIEF DESCRIPTION OF THE DRAWINGS

FIG. 2 is an illustrative diagram showing the side cross section view of a detector;

FIG. 3 is a plan view of an imaging device comprising a plurality of detectors;

DESCRIPTION OF THE PREFERRED EMBODIMENTS

Figure 1:
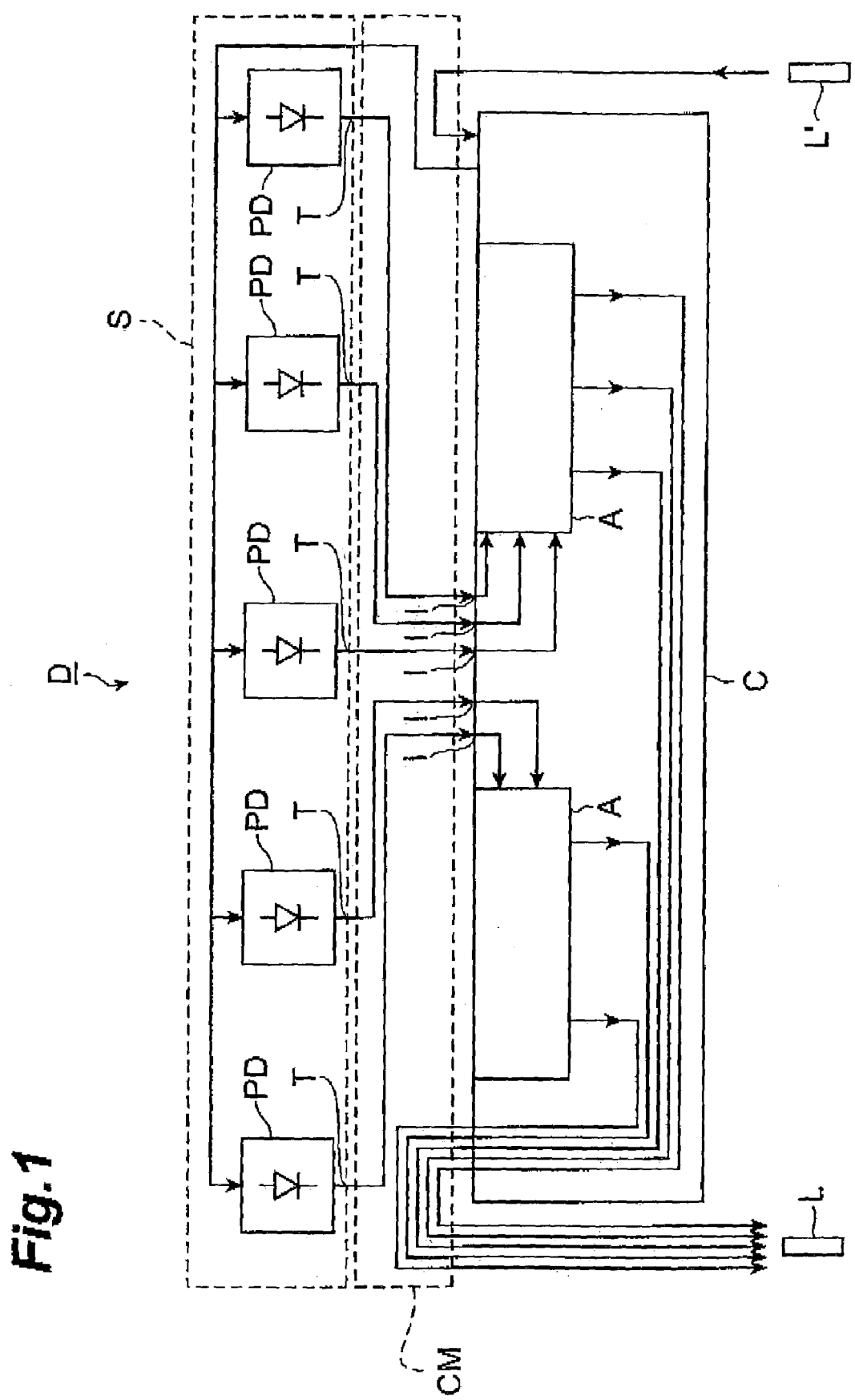
FIG. 1 is a block diagram showing the side face composition of a detector D relating to an embodiment of the invention.

Below, a detector relating to the present embodiment is described. The same reference numerals are used for the same elements and duplicated descriptions are omitted here.

FIG. 1 is a block diagram showing the side face composition of a detector D relating to this embodiment, and FIG. 2 is an illustrative diagram showing the side cross section view of the detector. The detector D comprises a semiconductor chip S, circuit substrate C, and connecting means CM for connecting same. A plurality of photodetector elements (photodiodes) PD are formed in a one-dimensional or two-dimensional fashion on the semiconductor chip 5, and a plurality of output terminals T of the photodetector elements PD are disposed on the surface thereof. These output terminals T directly oppose the circuit substrate C, but the structure varies depending on the type of photodetector element.

If the semiconductor chip S is aback-side illuminated photodiode, since the output terminals T are essentially located on the circuit substrate C side of the semiconductor chip S, they should be connected directly to the circuit substrate C. If the semiconductor chip S is a photodiode with a front side illuminated face, then the output terminals T are essentially located on the opposite side of the semiconductor chip S to the circuit substrate C, and therefore through holes or the like must be formed through the semiconductor chip S to extend the output terminals T to the back face side and connect same to the circuit substrate C.

The circuit substrate C comprises a plurality of input terminals I to which signals from the output terminals T of the semiconductor chip S are input.

The connecting means CM electrically connects the respective output terminals T to the respective input terminals I.

Here, the interval between the input terminals I is set to a narrower dimension than the interval between the output terminals T. Consequently, the circuit substrate C can be provided with a signal reading circuit A for reading out the signals from the input terminal I, in the region outside the region $R_I$ of the input terminals I.

In this detector, since the region $R_I$ of the circuit substrate C where the input terminal I is formed is smaller than the region of the semiconductor chip S where the output terminal T is formed, it is possible to form a signal reading circuit A in the region outside the input terminal forming region $R_I$ in the circuit substrate C, then the dimensions of the circuit substrate C can be reduced below those of the semiconductor chip S, and consequently, if a plurality of photodetectors D are arrayed together, respective semiconductor chips S can be arranged in a mutually proximate or contacting fashion.

Therefore, the blind area become small because the gap between pixel groups are extremely small, one of the pixel group being positioned at outermost periphery of one semiconductor chip and the other pixel group being positioned at outermost periphery of the other semiconductor chip. So, it is possible to pickup large images.

The connecting means CM also provides a connection from the electrical signal output of the circuit substrate C to an external lead L, or a connection from an external lead L' to an electrical signal input of the circuit substrate C. In this case, it is not necessary to use an additional electric wire, apart from the connecting means CM, and therefore the circuit composition can be simplified.

A portion of the power supply voltage applied to the circuit substrate C via the external lead L' is transmitted via the connecting means CM to the semiconductor chip S, and is used to drive the photodetector elements PD, whilst the other portion thereof is used to drive the signal reading circuit A. On the other hand, the output signals from the respective photodetector elements PD are input via the output terminals T, and input terminals I to and processed to the signal reading circuit A, and led out of the device by the external lead L. The signal reading circuit A according to this example is a single or multiplex circuit consisting of a scanning circuit such as shift resistors, switches, or the like, and a charge amplifier or integrated circuit, or the like. Furthermore, according to requirements, a correlated double sampling (CDS) circuit, or A/D converter, may be provided. The signal reading can be either serial or parallel.

According to requirements, the detector D according to this example may comprise a scintillator provided on the surface of the semiconductor chip S, and in this case, it is possible to apply the detector in an X-ray imaging apparatus, such as an X-ray CT device. An X-ray CT device captures an image of the X rays from an X ray source which are transmitted by a body under observation, and uses a plurality of detectors D in an aligned fashion.

Figure 4:
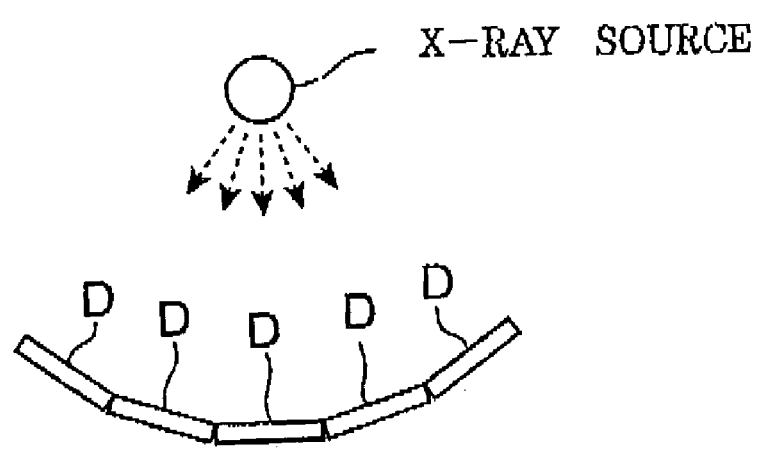
FIG. 4 is a side view of an imaging device.

FIG. 3 is a plan view of an imaging device when viewed from the light illuminated surface, the imaging device consisting of a plurality of detectors, and FIG. 4 is a side view of an imaging device. Square shaped semiconductor chips S are arranged in mutually proximate fashion without any intervals therebetween, on the front surface. In this example, an imaging device comprising a 4 row by 5 column group of detectors is illustrated. Here, the detectors D forming the imaging device are aligned in parallel with one axial direction, in such a manner that they are spaced at equal distances from the X ray source. This does not exclude the possibility of disposing detectors D in alignment with two orthogonal axes, in such a manner that they are spaced at equal distances from the X ray source. Moreover, the detectors D may also be disposed in such a manner that that the imaging face of the imaging element is flat.

Figure 5:
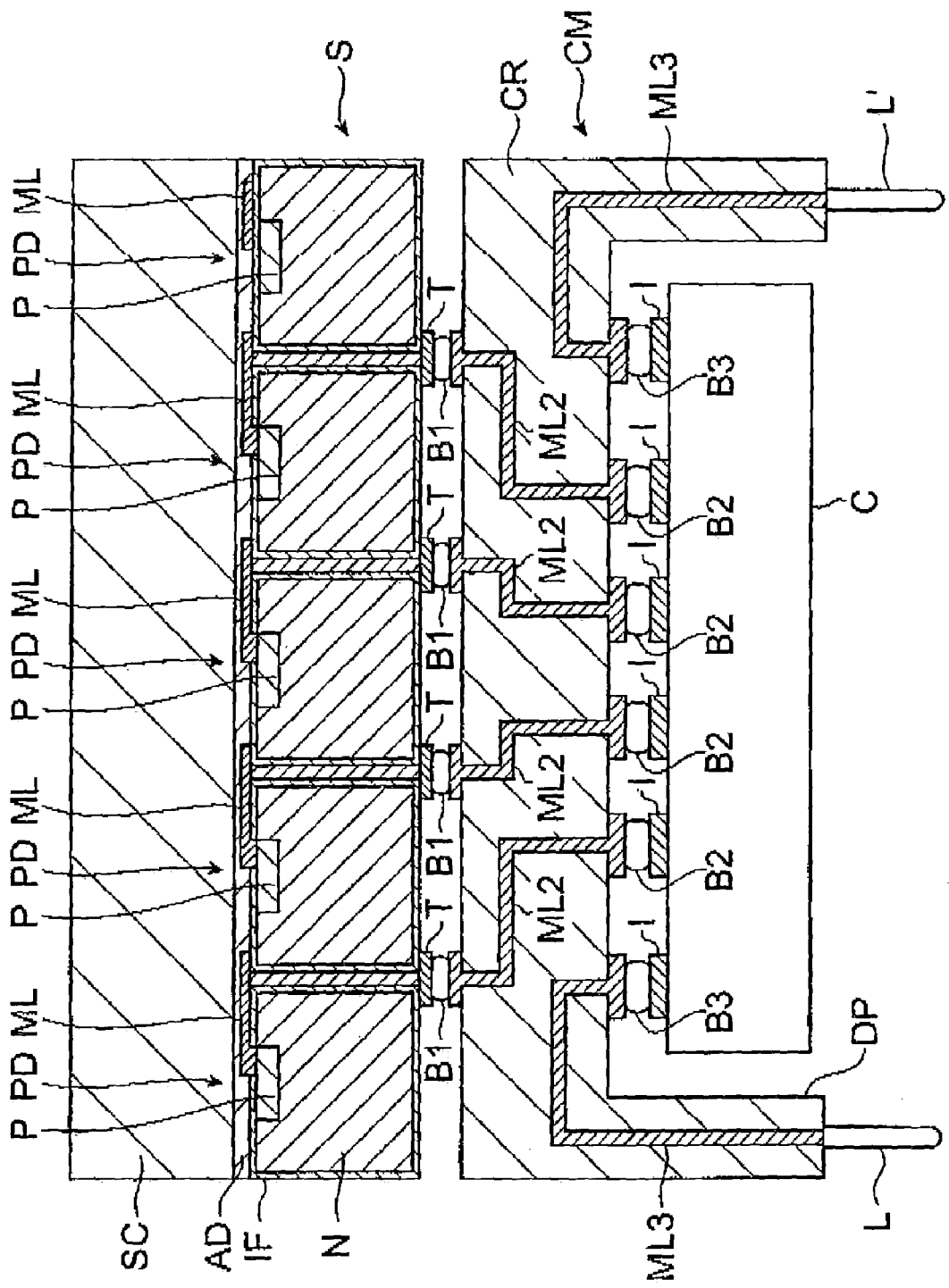
FIG. 5 is a vertical sectional view of a detector D being a preferred example of the detector D shown in FIG. 1.

FIG. 5 is a cross-sectional view of a detector D showing a preferred example of the detector D illustrated in FIG. 1. The semiconductor chip S comprises an array of photodetector elements having a front side illuminated face (photodiode array), and each photodetector element has a PN junction.

The P type semiconductor (P) creating the anode forming one part of the PN junctions is disposed on the surface side of the semiconductor chip, and is connected to an output terminal T provided on the back face, by means of a metal wire ML buried in a through hole which passes through the thickness of the semiconductor chip. The material of metal wire ML is not limited to a metal. The material of the metal wire ML can be made of an impurity-doped low resistance semiconductor. This P type semiconductor (P) has a high concentration of P type impurity. Moreover, the photodetector element PD disposed on the right-hand end of the diagram is connected to the output terminal of the back face of the chip via a metal wire ML passing in the thickness direction of the paper in the diagram, similarly to the other photodetector elements PD, but it is not represented in the drawing.

Moreover, it may diffuse the high concentration N-type impurities (isolation area) into the regions between the respective detection elements PD of the semiconductor chip S in order to isolate the pixels. Though a cathode electrode isn't illustrated in the figure, such a cathode electrode can be formed by forming the isolation area or an N-type high concentration impurities area in the suitable position of the surface. It is possible to provide this cathode electrode on the circuit substrate side of the chip via a through hall as the anode electrode is provided. Or, it is possible that a cathode electrode is made by forming a structure made by diffusing N-type high concentration impurities into a suitable place of the semiconductor chip S, the place being facing to the circuit substrate. In this case, the cathode electrode can be derived from the circuit substrate side of the chip. At any rate, the cathode electrode is connected to the connection means CM through the bump, too.

In this example, the connecting means CM constitutes a supporting substrate of the semiconductor chip S and serves to increase the mechanical strength of the detector D. This supporting substrate CM comprises a depression DP which accommodates the circuit substrate C, and the circuit substrate C is protected by means of the supporting substrate CM in the package. In the supporting substrate CM, metal wires ML2 are buried inside a ceramic substrate CR, and metal wires ML2 are connected to the output terminals T and the input terminals I. Ceramic has excellent insulating properties, and hence the metal wires ML2 are isolated from each other by the ceramic substrate CR and a multi-layer wiring structure is formed inside the substrate.

The output terminals T of the semiconductor chip S and one face of the supporting substrate CM are connected via bumps B1, whilst the other face of the supporting substrate CM and the input terminals I of the circuit substrate C are connected via bumps B2.

Furthermore, metal wires ML3 buried inside the supporting substrate CM are connected via bumps B3 to the external leads L, L' and the circuit substrate C. The outside lead L, L' can be the products which consist of the wiring films (a flexible circuit substrate), TAB tapes or the like, the base material of the wiring film being made of a metal pin, a metal ball or an organic film such as polyimide. When the above wiring film is used, an electrical connector can be provided on a opposite side of the wiring film from the connecting means CM.

This detector D comprises a semiconductor chip S on which a plurality of photodetector elements PD are formed, a circuit substrate C to which the output signal from the semiconductor chip S is input, and a supporting substrate CM (hereinafter, SB) which supports the semiconductor chip S and the circuit substrate C, the dimensions of the supporting substrate in the directions (X, Y directions) opposite to the thickness direction (Z direction) thereof being equal to or less than the dimensions of the semiconductor chip in the directions (X, Y directions) opposite to the thickness direction (Z direction) thereof. This means that the supporting substrate is of smaller dimensions in both X and Y directions.

In this detector, since the dimension of the supporting substrate CM is equal to or smaller than the dimension of the semiconductor chip S, it is possible to align a plurality of semiconductor chips S in a very proximate fashion or a contacting fashion. The circuit substrate C is a substrate on which a circuit is formed. Since the supporting substrate CM constitutes a portion of the package accommodating the circuit substrate C, the circuit substrate C is protected by the package, but in this case, the dimensions of the circuit substrate C in the directions (X, Y directions) opposite to the thickness direction (Z direction) thereof are less than the dimensions of the semiconductor chip S in the directions (X, Y directions) opposite to the thickness direction (Z direction) thereof. The circuit substrate C is smaller in both the X direction and the Y direction.

In other words, this detector comprises a semiconductor chip S on which a plurality of photodetector elements PD are formed, and a circuit substrate C to which all the output signals of the semiconductor chip S are input, the dimensions of the circuit substrate C in the directions orthogonal to the thickness direction being less than the dimensions of the semiconductor chip in the directions orthogonal to the thickness direction. Since the circuit substrate C to which all of the output signals of the semiconductor chip S are input is small, it is possible to align a plurality of semiconductor chips S in a very proximate or mutually contacting fashion.

Moreover, a composition is adopted wherein an insulating film IF is formed on the side wall of the through hole and the front surface and back face of the semiconductor chip S, and the metal wires ML are not connected electrically to any elements other than the P type semiconductors (P). Note that the insulating film IF consists of a single film or a film stack. A scintillator SC is provided on the surface of the semiconductor chip S, via an adhesive AD. The scintillator SC is coupled optically to the light receiving face of the semiconductor chip S. When radiation, such as X rays, is incident on the scintillator SC, fluorescence is generated. This fluorescence can be detected by the plurality of photodetector elements PD provided on the semiconductor chip S. This fluorescence is similar to an X ray image, and therefore X ray images can be captured by means of this imaging device. The material of the scintillator SC in the present example is CWO:CdWO$_4$ (cadmium tungstate) or Gd$_2$O$_2$S, but other materials may also be used.

An activation element (Eu) may be added to the Gd$_2$O$_2$S. By adjusting the concentration of the activator element (Eu) added to the crystals (Gd$_2$O$_2$S) to an optimum value, it is possible to generate fluorescence in the three primary colors, red, green and blue, in response to the X rays, and hence the dynamic range can be varied. The scintillator is applicable to the semiconductor chip such as CCD image pickup device using photodetector elements as the constituent pixels. Tb, or the like, may also be used as the additive. The scintillator SC may cover a plurality of photodetector elements PD and may also cover a plurality of semiconductor chips S.

Here, a short description of the function of the photodetector element PD forming the photodiode is given.

Figure 6:
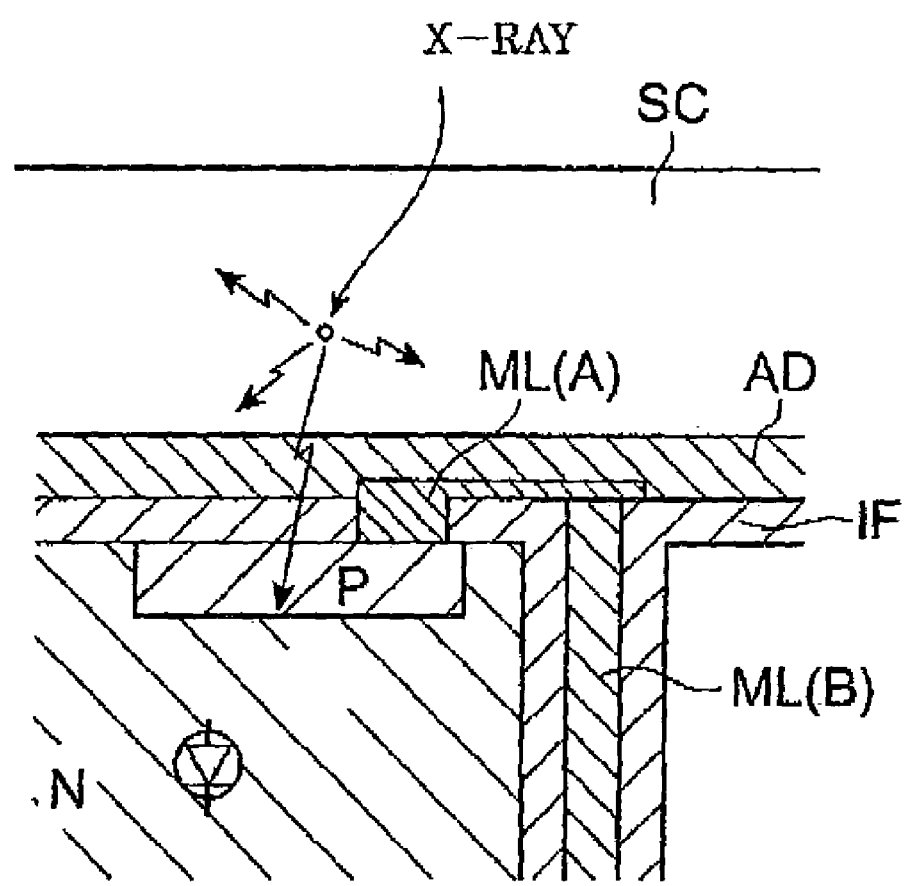
FIG. 6 is a sectional view of a detector D in the vicinity of the PN junction.

FIG. 6 is a sectional view of a photodetector element D in the vicinity of the PN junction. When X rays are incident on the scintillator SC, fluorescence is generated by the scintillator SC, and when this fluorescence is incident on the PN junction, carriers are generated inside the semiconductor depletion layer and one of the carriers is extracted out of the device via the metal wires ML. The metal wires ML comprise a surface electrode section ML (A) which contacts with the P type semiconductor (P) and a through electrode section ML (B) which passes through the inside of a through hole.

The surface electrode section ML (A) is made from Al, and the through electrode section ML (B) is made from polycrystalline Si. After forming through holes in the semiconductor chip S made from Si, it is possible to form a thermal oxide film (SiO$_2$) on the exposed face of the semiconductor chip S and the through hole. The formed oxide film can be processed using a suitable photolithography technique, and it is possible to form insulating film by a CVD (chemical vapour deposition) or sputtering method, as required.

Figure 13:
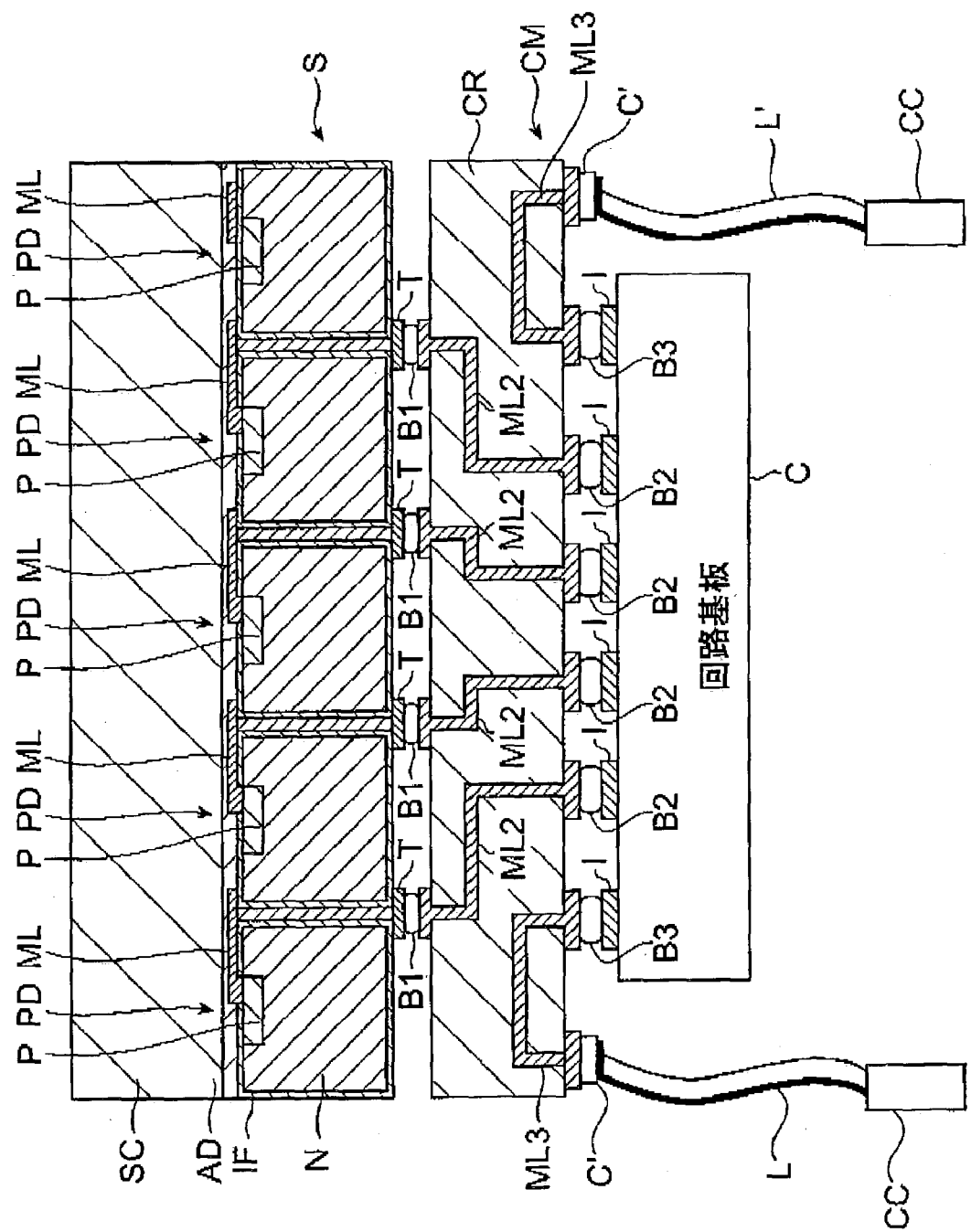
FIG. 13 is a vertical sectional view of a detector D being a preferred example of the detector D shown in FIG. 1.

FIG. 13 is a vertical sectional view of a detector D being a preferred example of the detector D shown in FIG. 1. This photodetector D is only partially different from that illustrated in FIG. 5. That is, this detector D do not have the depression DP in the connecting means CM. According to the present embodiment, the connecting means CM can be made at low price because it does not need to form the depression DP. Further, the connection defects of the bumps B2, B3 are decreased.

In this embodiment, an example that the film wiring (flexible wiring substrate) is used as the external lead L, L', is shown. The film wiring is made by forming electrical wiring on or inside an organic film such as polyimide, the film wiring has exposed wiring electrodes at the connecting means CM side, and is connected to the terminal of the metal wiring ML3 of the connecting means CM by the conductive member C'. The conductive member C' is made of solder, a material used as bump, anisotropic conductive film (ACF), anisotropic conductive paste (ACP), NCP (nonconductive paste), or the like. These materials can be combined when used. The other side of the film wiring as the external lead L, L' has an electric connector CC for connecting the wiring to an external device. When using the film wiring as the external lead L, L', the flexibility of the connection with the external device is increased. Besides the above materials, the external lead L, L' can be made of soldered metal pins or metal balls, TAB tape, or the like.

Figure 7:
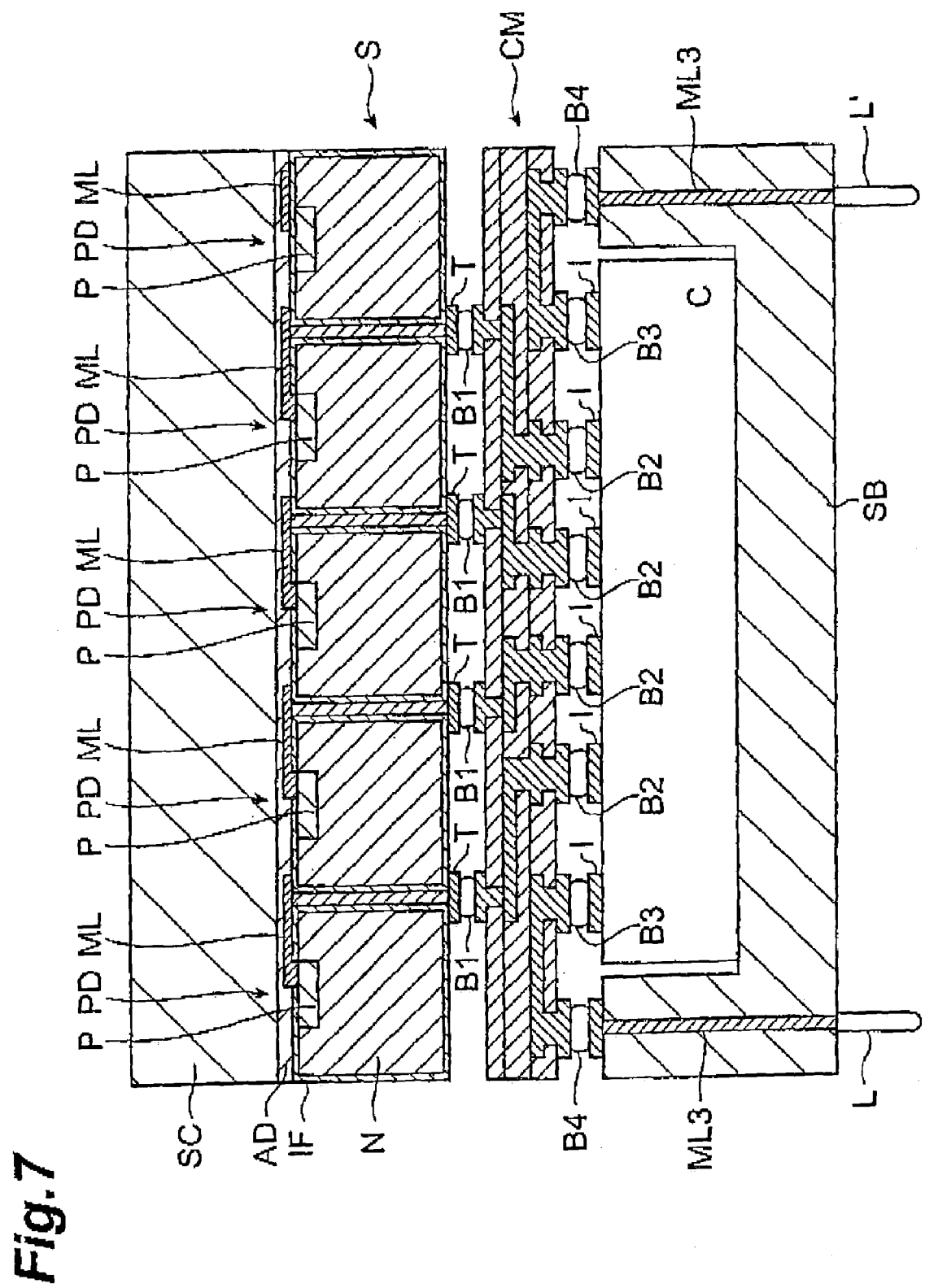
FIG. 7 is a vertical sectional view of a detector D being a further preferred example of the detector D shown in FIG. 1.

FIG. 7 is a vertical sectional view of a detector D forming a further preferred example of a detector D as illustrated in FIG. 1. This photodetector D is only partially different from that illustrated in FIG. 5.

More specifically, the connecting means CM is made from a multi-layer wiring substrate, and the output terminals T of the semiconductor chip S and one face of the multi-layer wiring substrate CM are connected by means of bumps B1, whilst the other face of the multi-layer wiring substrate CM and the input terminals I of the circuit substrate C are connected via bumps B2.

Moreover, the circuit substrate C is accommodated inside a supporting substrate SB having a depression, and the supporting substrate SB forms a package, bumps B4 provided on the end face of the opening in the substrate being connected via bumps B3 and the multi-layer substrate CM to the circuit substrate C, and the output of the circuit substrate C being read out successively via the bumps B4, and metal wires ML3 formed inside the supporting substrate SB which is made from ceramic base member, to the external leads L. Furthermore, input from external leads L' is transmitted via the metal wires ML3, bumps B4, multi-layer substrate CM and bumps B4 to the circuit substrate C.

The remaining composition thereof is the same as that illustrated in FIG. 5.

In the case of the structure in this example, since the semiconductor chip S, multi-layer substrate CM and circuit substrate C can be formed independently, it is possible to increase the production yield, and furthermore, a merit is obtained is that the overall thickness can be reduced by using a thin multi-layer substrate CM, compared to a ceramic base member.

Here, the circuit substrate C and the supporting substrate SB are mutually contacting. In this case, since the heat generated in the circuit substrate C is transmitted directly to the supporting substrate SB, it is possible to increase the cooling efficiency of the circuit substrate C, provided that a heat radiating material (a metal or copper alloy (CuBe, CuW) heat sink) is used for the supporting substrate SB, therefore, faulty operation of the circuit and noise can be suppressed.

Moreover, if the circuit substrate C and scintillator SC are contacting each other, then in fabricating the element, after the circuit substrate C has been installed on the supporting substrate SB, it is possible to install the connecting means CM on the circuit substrate C by means of the bumps B2, B3, B4, and it is also possible to install the semiconductor chip S on the connecting means CM by means of the bumps B1. In other words, there are two installation tasks involving bumps.

Moreover, it is also possible to separate the circuit substrate C from the supporting substrate SB. In this case, one face of the connecting means CM is installed on the circuit substrate C via bumps B2, B3, whereupon the semiconductor chip S is installed on the other face of the connecting means CM via bumps B1. Thereupon, one side of the connecting means CM is installed on the supporting substrate SB via bumps B4. In this case, since the circuit substrate C is in a free floating state, it is not necessary to adjust the height of the depression of the supporting substrate SB and the circuit substrate C.

Figure 8:
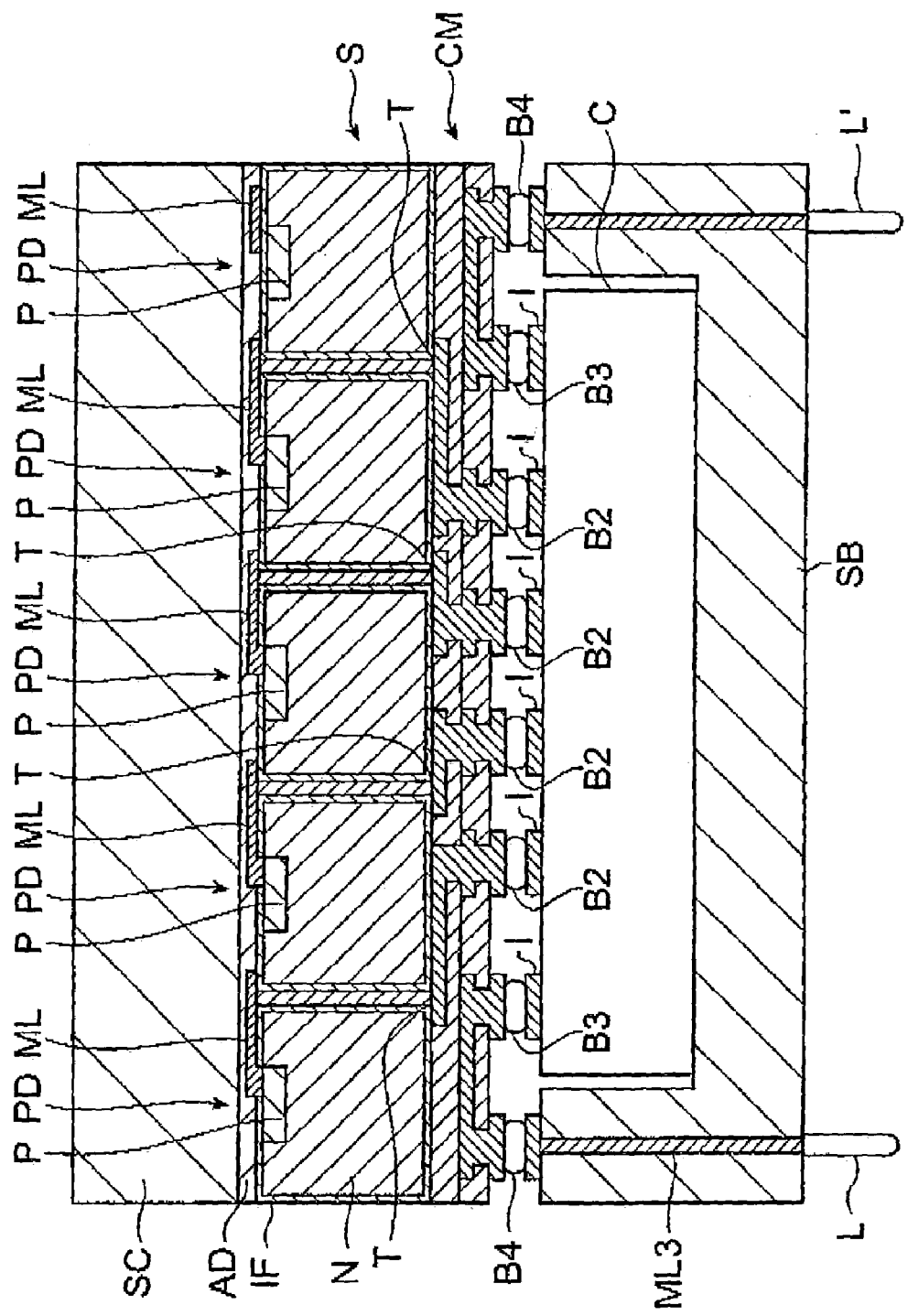
FIG. 8 is a vertical sectional view of a detector D being yet a further preferred example of the detector D shown in FIG. 1.

FIG. 8 is a vertical sectional view of a detector D which is a further preferred example of a detector D illustrated in FIG. 1. This detector D is only partially different from that illustrated in FIG. 7. In other words, the connecting means CM consists of a thin-film multi-layer wire formed on the back face of a semiconductor chip S, and the thin-film multi-layer wire CM and input terminals I of the circuit substrate C are connected by means of bumps B2.

The remaining composition is the same as that shown in FIG. 7.

Since the thin-film multi-layer wire has an extremely small thickness (2 mm, or less), it is possible dramatically to reduce the overall thickness. The output terminals T of the semiconductor chip S in this example are disposed at the boundary between the thin-film multi-layer wire CM and the semiconductor chip S, and as described above, the interval between the input terminals I is set to a narrower dimension than the interval between the output terminals T.

In the present example, the circuit substrate C and the supporting substrate SB are mutually contacting. In this case, since the heat generated by the circuit substrate C is transmitted directly to the supporting substrate SB, it is possible to increase the cooling efficiency of the circuit substrate C, provided that a heat radiating material (a metal or copper alloy (CuBe, CuW) heat sink) is used for the supporting substrate SB, therefore, faulty operation of the circuit and noise can be suppressed.

Furthermore, if the circuit substrate C and supporting substrate SB are caused to be mutually in contact, then during fabrication of the element, after installing the circuit substrate C on the supporting substrate SB, it is possible to connect the semiconductor chip S electrically to the circuit substrate C, simply by installing the connecting means CM on the circuit substrate C via the bumps B2, B3, B4. In other words, there is one installation operation involving bumps.

Furthermore, it is also possible to separate the circuit substrate C and the supporting substrate SB. In this case, one face of the connecting means CM is installed on the circuit substrate C via the bumps B2, B3, whereupon the one face of the connecting means CM is installed on the supporting substrate SB by means of bumps B4. In this case, since the circuit substrate C is in a free floating state, it is not necessary to adjust the height of the depression of the supporting substrate SB and the circuit substrate C.

As described above, according to the aforementioned respective detectors D, it is possible to form an signal processing circuit A on the region to the outside of the region $R_1$ where the input terminals are formed on the circuit substrate C, and hence the dimensions of the circuit substrate C can be made smaller than those of the semiconductor chip S, which means that when a plurality of detectors Dare aligned, the respective semiconductor chips can be disposed in mutually proximate fashion or mutually contacting fashion. Therefore, the blind area become small because the gap between pixel groups are extremely small, one of the pixel group being positioned at outermost periphery of one semiconductor chip S and the other pixel group being positioned at outermost periphery of the other semiconductor chip S. So, it is possible to pickup large images.

The aforementioned connecting means CM may also use, in addition to the ceramic base material, a glass, polyimide or epoxy organic material, or a compound material of these. Moreover, desirably, the bumps B2, B3 or B4 have a different melting point to the bumps B1 connecting to the semiconductor chip S. For the material of the bumps B1, it is possible to use Au that can be made of a wire, Ni that can be plated, a stack of Ni and Au, solder or a resin including conductive filler. The melting point of solder can be controlled by adjusting the kind of metal materials and their composition. For example, PnSn solder system, SnAg solder system or AuSn solder system is typical, and the melting points of these materials can be adjusted by varying their composition or by adding Cu, Ag, Bi or In. Therefore, the solder material which is suitable for mounting can be chosen, and is not limited to a eutectic alloy. AuSn or an alloy thereof, in a suitable composition, and for the material of the bumps B2, B3, B4, it is possible to use SnAg or an alloy thereof, in a suitable composition. Moreover, desirably, the melting points of the bumps B1, bumps B2, bumps B3, and bumps 134 should be successively higher, in that order, and in this case, assembly is facilitated, since assembly can be performed in order from the higher melting point.

The typical mounting method with using bump is a thermo compression bonding or a flip-chip bonding using supersonic waves.

In the present embodiment, the bums are directly attached to the semiconductor chip S, connecting means, and/or the circuit substrate. However, the connecting method is not limited to this method, and it is also possible to use a set of bumps and an anisotropic conductive film ACF, bumps and an anisotropic conductive paste ACP, bumps and nonconductive paste NCP, or the like. When using these methods, it is not necessary to use an underfill resin (not shown) filling operation for increasing the mounting strength after the bump connection.

Moreover, the photodetector element described above is not limited to being a front side illuminated type element, and it is also possible to use a back-side illuminated type element (photodiode array) formed into a thin sheet, having a PN junction on the connecting means side (back face side) of the semiconductor substrate.

Figure 9:
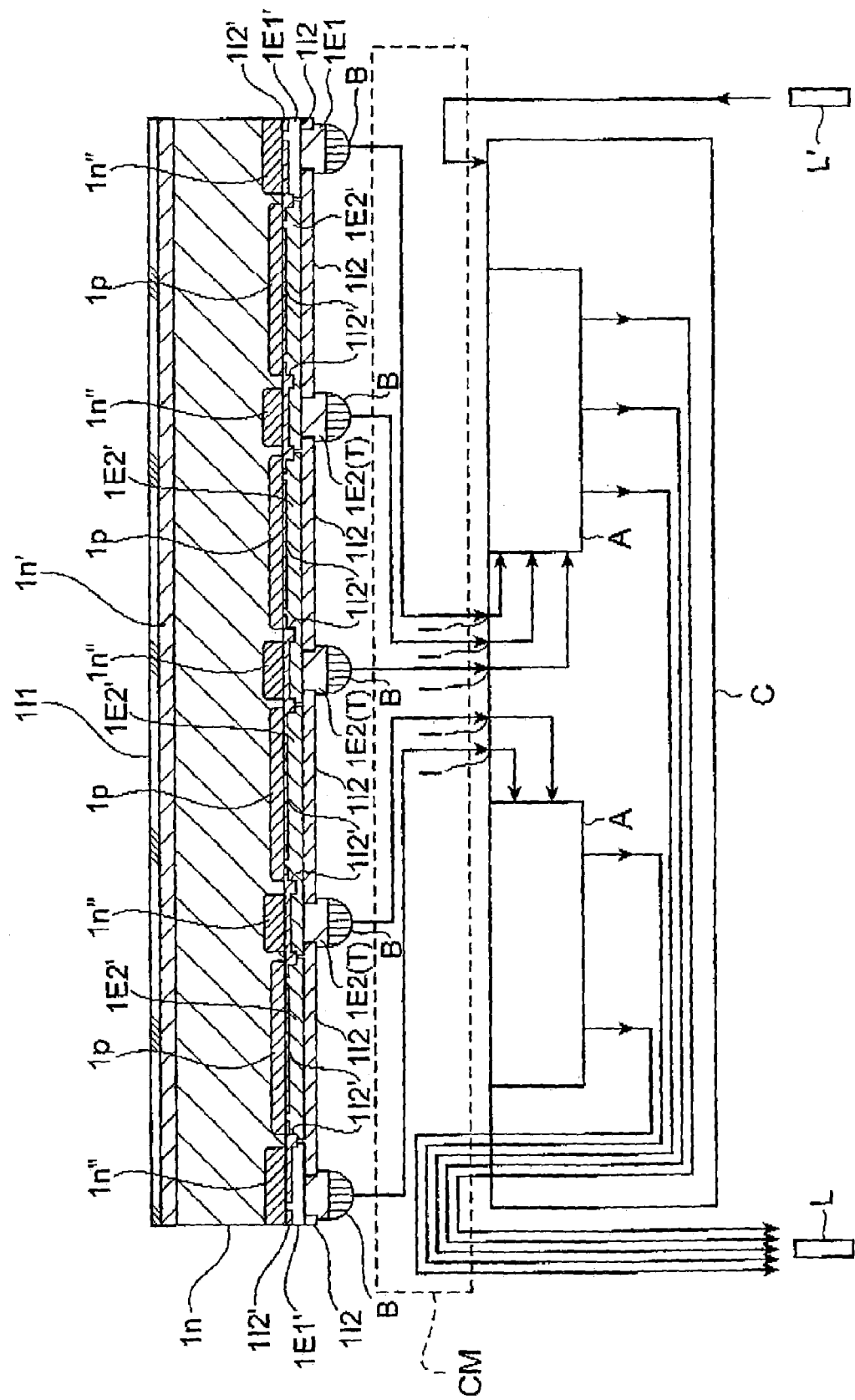
FIG. 9 is a diagram showing the side face composition of a detector D having a thin semiconductor chip.

FIG. 9 shows the side face composition of a detector D having a thin type semiconductor chip S.

This semiconductor chip S comprises output terminals T which respectively extract the outputs of a plurality of photodetector elements, these output terminals T being connected to the input terminals I of a circuit substrate C, by means of any of the connecting means CM described above.

In the detector D described in the following example, the composition other than the semiconductor chip S is the same as that in the aforementioned embodiments, and therefore only the composition of the semiconductor chip S is described below. In the detector D described in the following example, it is possible to dispose a scintillator on the light incidence surface of the semiconductor chip S.

The semiconductor chip S according to this example comprises a high concentration impurity layer $1n'$ forming an accumulation layer, provided on the surface of a thin n-type semiconductor substrate $1n$ made from Si, on the incident light receiving side thereof, and a plurality of p-type semiconductor regions $1p$ (boron-doped regions) are provided on the connecting means CM side. A pn junction (photodetector element: photodiode) is formed between the n-type semiconductor substrate $1n$ and each p-type semiconductor substrate $1p$. The photodetector element formed by each pn junction generates electron/hole pairs (carriers) in response to the light incident on the back face of the semiconductor chip S. A reverse bias can be applied to this pn junction of the photodetector element, if necessary. When applying the bias to the element, the depth of the depletion layer increases, and the detection sensitivity and the response speed to the light input can be increased.

The n-type separating regions $1n''$ are formed in the front surface region of the semiconductor substrate in and the wiring electrodes $1E1'$ for cathode electrodes form an ohmic contact with the n-type separating region $1n''$, the wiring electrodes $1E1'$ being connected to the cathode electrodes $1E1$, respectively. The wiring electrodes $1E2'$ for anode electrodes form an ohmic contact with the p-type semiconductor region $1p$, the wiring electrodes $1E2'$ being S connected to the anode electrodes $1E2$, respectively. The bump electrodes B are formed on the cathode electrodes $1E1$ and the anode electrodes $1E2$, and the aforementioned reverse bias is applied between the electrodes $1E1$ and the electrodes $1E2$ via the bump electrodes B.

Each pn junction functions as a pixel, and the n-type separating regions $1n''$ are formed in the region between the pixels for electrically isolating the pixels. One of the carriers generated in each pn junction is input to each input terminal I of the circuit substrate C via the connecting means CM. The electrodes $1E2$ of the semiconductor chip S are bonded to the connecting means CM via the bump electrodes B.

Note that an insulating film $1I1$ is formed on the back surface of the semiconductor substrate $In$, the film $1I1$ functioning as a protection film and an anti-reflection (AR) film. This insulating film $1I1$ consists of a thermal oxide film ($SiO_2$), or a single layer or a film stack of SiN and/or SiON. An insulating film $1I2'$ is formed on the surface of the substrate in for protecting the surface where the dopants of the regions $1n''$ and $1p$ are diffused. An insulating film $1I2$ is formed on the front side wiring electrode, the film $1I2$ having openings only where the cathode electrodes $1E1$ and the anode electrodes $1E2$ are formed. This insulating film $1I2$ also consists of a thermal oxide film ($SiO_2$), or a single layer or a film stack of SiN and/or SiON.

Moreover, the relative resistance of the semiconductor substrate in is approximately 50 $\Omega$-cm to 10 k$\Omega$-cm. The depth of the high concentration impurity layer $1n'$ on the back side is 0.1 µm to several µm and has a carrier density of at least $1 \times 10^{17}$ cm$^{-3}$ or above, formed by thermal diffusion or ion implantation of phosphorous or arsenic.

After forming the regions $1p$ and $1n''$ in the front surface region of the semiconductor substrate $1n$, the back side of the substrate is thinned by polishing or etching. After that, an accumulation layer is formed at the back side of the semiconductor substrate to obtain the semiconductor chip S with thickness of for example approximately 10 to 250 µm. The preferable thickness of the semiconductor chip S (semiconductor substrate) is approximately 50 to 100 µm. Since the semiconductor substrate of this semiconductor chip S is thin, that is, the distance between the light illuminated back side surface and the pn junction is small, the carrier traveling distance becomes short, the carrier being generated in response to the light incidence. Therefore, the present device can obtain a high sensitivity, a high speed response and a low crosstalk between the pixels.

Note that the pixels (p-type semiconductor region $1p$) positioned at right side of the figure is connected to the anode electrode $1E2(T)$ via the wiring for the anode electrode as the other pixels (p-type semiconductor region $1p$) are connected, the wiring extending perpendicular to this paper, but not depicted in the figure.

Figure 10:
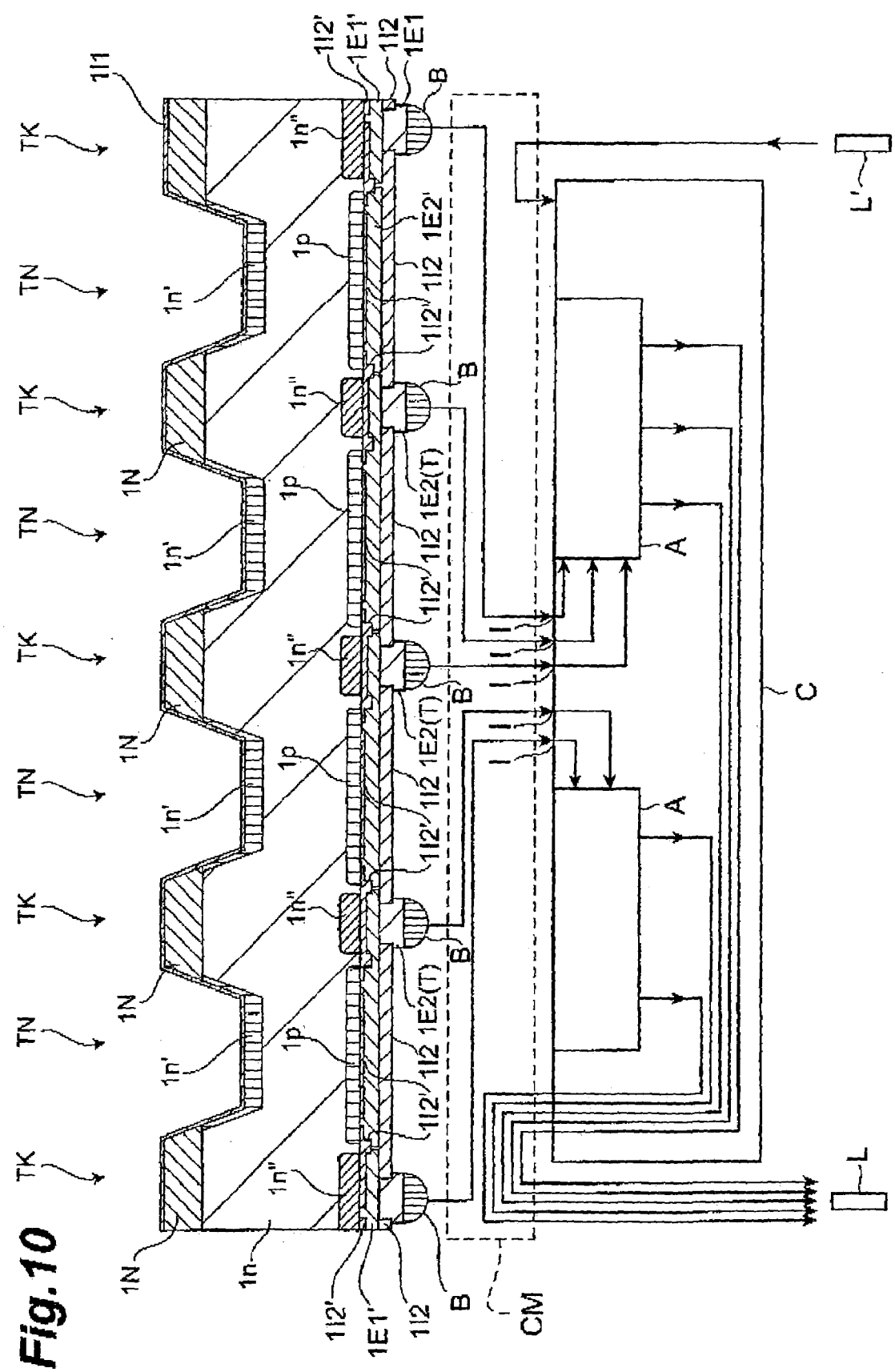
FIG. 10 is a diagram showing the side face composition of a detector D comprising a semiconductor chip having an undulating section on the light incidence side thereof.

FIG. 10 shows the side composition of a detector provided with a semiconductor chip S having undulating sections on the side where the light is incident thereon.

In the detector D described in this example, the composition other than the semiconductor chip S is the sane as that of the foregoing embodiments, and below, on the composition of the semiconductor is described. In the detector D described in the following example, a scintillator can be disposed on the light incidence face of the semiconductor chip S.

The points of differences between this semiconductor chip S and the semiconductor chip S illustrated in FIG. 9 are that (1) the maximum thickness of the semiconductor substrate $1n$ is approximately 150 to 600 µm, and the substrate has a small thickness at the photodetector element formed by pn junctions (photodiode); (2) an n-type high-density impurity region 1N is provided in the thicker regions of the back face of the substrate; and (3) anode electrodes $1E2$ (output terminals: T) are disposed on the separated regions $1n''$ of each photodiode via the insulating film $1I2'$ Note that the arrangement of the electrodes $1E2$ are not limited to on the region $1n''$.

The thickness of the thin portions TN of the semiconductor substrate In is about 50 µm–300 µm, and the thickness of the thick portions TK thereof is about 150–600 µm. The thin portions TN are set to a smaller thickness than the thick portions TK. The plurality of thin portions TN, together with the plurality of thick portions TK, constitute an undulating section, and the thick portions TK are formed in a lattice fashion.

Moreover, the density of the impurity in the high concentration impurity region 1N is $1\times10^{15}$ to $1\times10^{20}$ cm$^{-3}$, and the depth is about 2 µm to 200 µm. The high concentration impurity layer 1n' which functions as an accumulation layer is formed over the whole of the back face of the substrate, and the thickness thereof is 0.1 to several µm. An insulating film 1I1 is formed on the back face of the substrate, and insulating layer 1I2' is formed on the front surface of the substrate. The wiring electrodes 1E1' for the cathode electrodes and the wiring electrodes 1E2' for the anode electrodes are formed on the insulating film 1I2'. Each of the wiring electrodes 1E1', 1E2' passes through a contact hole formed in the insulating layer 1I2' and makes electrical contact with n-type and p-type semiconductor impurity regions 1n", 1p, respectively.

The anode electrode 1E2 (output terminal T) is disposed on the separating region 1n" of each photodiode, via an insulating layer 1I2'. The anode electrode 1E2 and the separating region 1n" are set so as to correspond to a thick portion TK. The anode electrode 1E2 is pressed against the connecting means CM via a bump electrode B, but since the anode electrode 1E2 is disposed on a thick portion TK, it is possible to prevent breaking of the substrate caused by the pressing action.

An insulating film 1I2 is formed on the wiring electrodes 1E1' 1E2', and these electrodes 1E1' 1E2' are connected to the cathode electrodes 1E1 and 1E2 through contact holes provided on an insulating film 1I2', respectively.

In this semiconductor chip S, since the semiconductor substrate in is thin in the thin portions TN, that is, the distance between the back side illuminated surface and pn junction is small, the traveling distance of the carrier generated in response to light incidence becomes short. Therefore, the present device can obtain a high sensitivity, a high speed response and a low crosstalk between the pixels. Further, since the high concentration semiconductor regions 1N are formed in the thick portions TK, it is possible to reduce cross-talk between the pixels. The thin portions TN form a lattice shaped mask on the back face of the substrate, and can be formed by etching the substrate using a mask.

Figure 11:
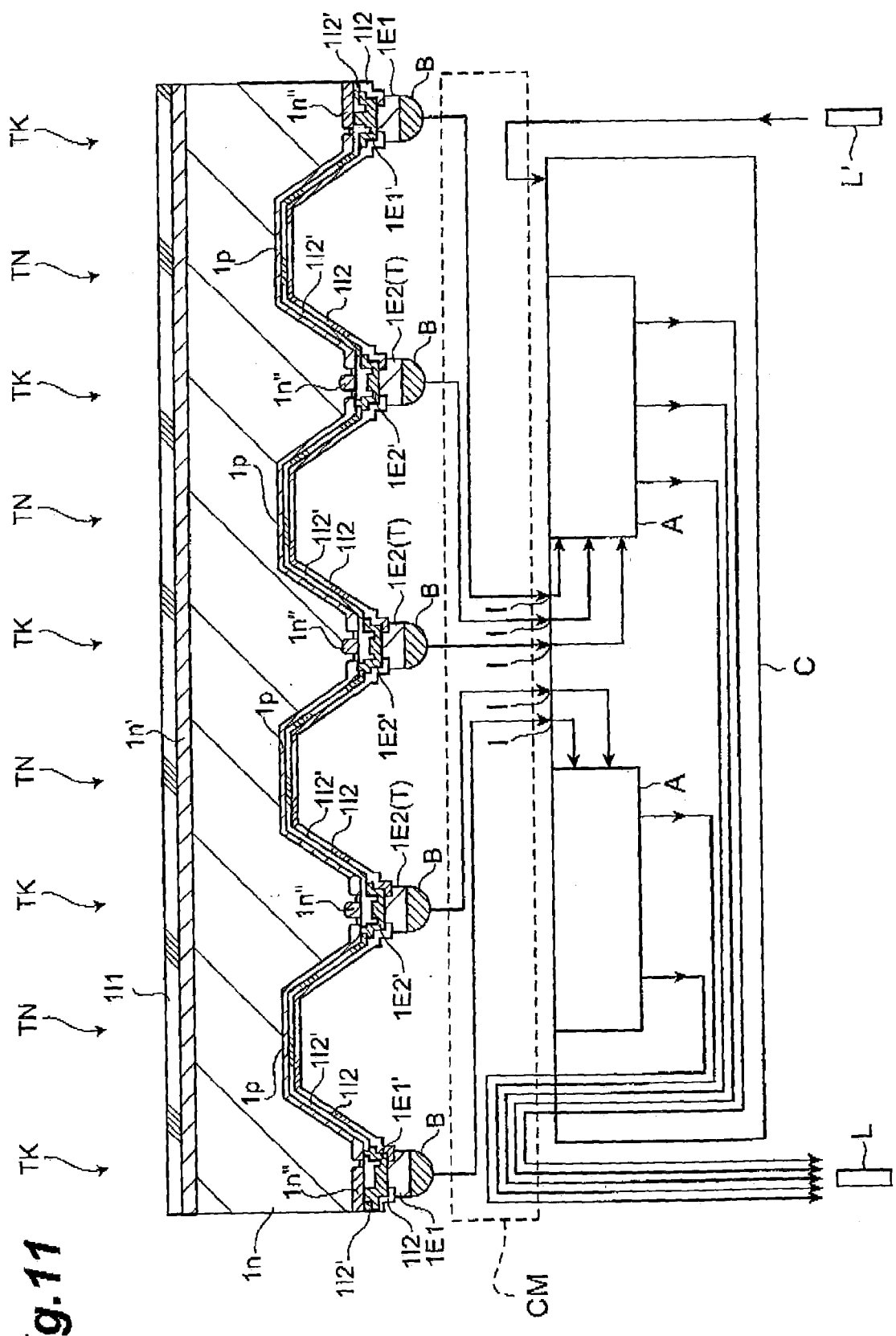
FIG. 11 is a diagram showing the side face composition of a detector D comprising a semiconductor chip having an undulating section on the circuit substrate side thereof.

FIG. 11 shows the side composition of the detector D having a semiconductor chip S with undulating section on the circuit substrate side.

In the detector D described in this example, the composition other than the semiconductor chip S is the same as that in the foregoing embodiment, and hence only the composition of the semiconductor chip S is described below. In the detector described in the following example, a scintillator can be disposed on the light incidence face of the semiconductor chip S.

The points of difference between this semiconductor chip S and the semiconductor chip S shown in FIG. 10 are the fact that the light incidence face of the substrate is flat and the undulations are formed on the front surface on the connecting means CM side. In other words, p-type semiconductor regions 1p are disposed in the base region of the thin portions TN and separating regions 1n" are formed in the thick regions TK.

The thin portions TN of the present example can be formed by creating a lattice shaped mask on the substrate surface (connecting means CM side) and then performing etching using this mask. In this semiconductor chip S, since photodiodes are formed in the thin portions, the traveling distance of the carrier generated in response to light incidence becomes short, thereby the present device can obtain a high sensitivity, a high speed response and a low crosstalk between the pixels.

Figure 12:
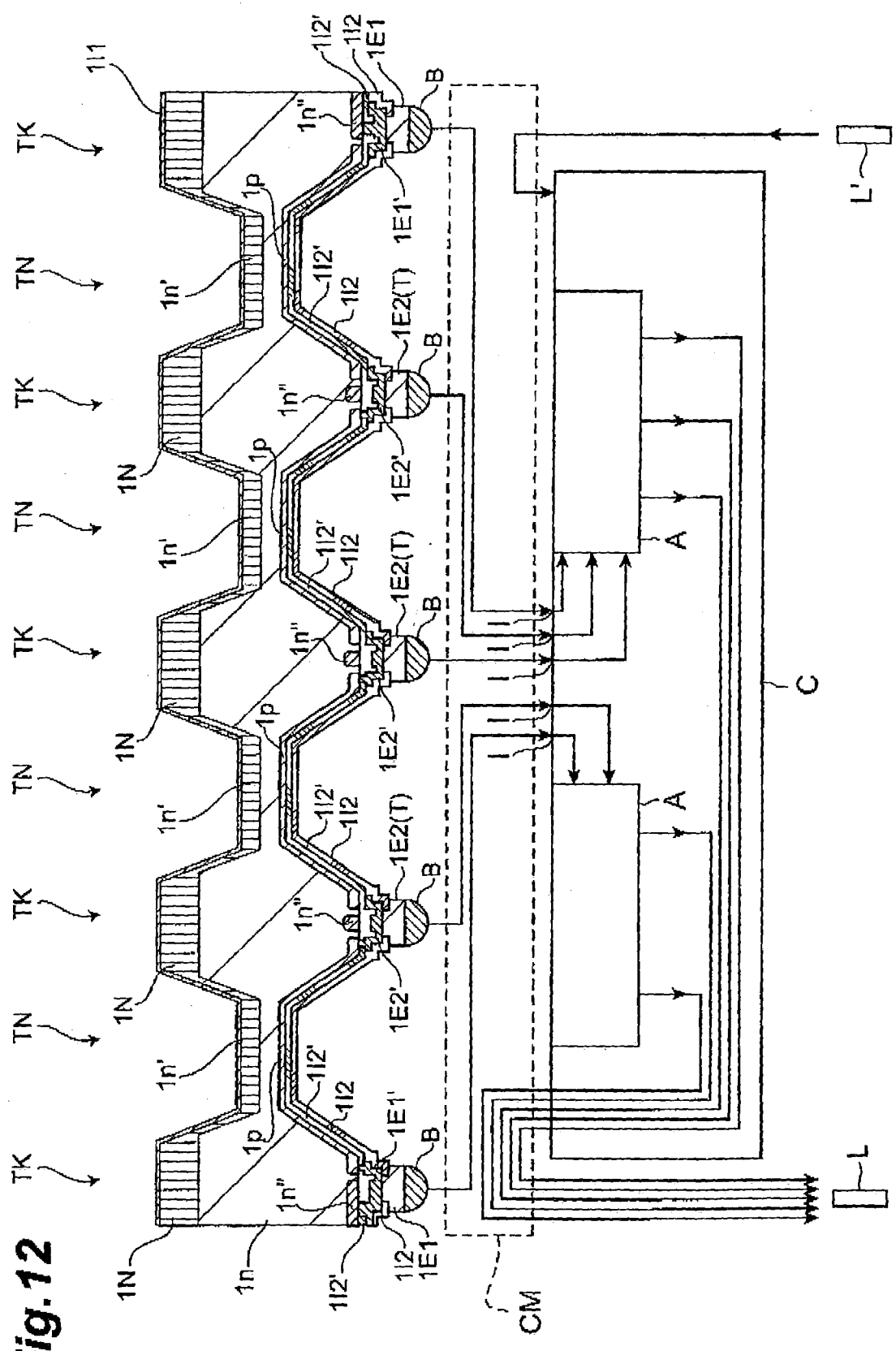
FIG. 12 is a diagram showing the side face composition of a detector D comprising a semiconductor chip having undulating sections on the light incidence side and the circuit substrate side thereof.

FIG. 12 shows the side composition of the detector D provided with a semiconductor chip S having undulating sections on the light incidence side and the circuit substrate side.

In the detector D described in this example, the composition other than the semiconductor chip S is the same as that in the aforementioned embodiments, and hence only the composition of the semiconductor chip S is described below. Moreover, in the detector D described in the following example, a scintillator can be disposed on the light incidence face of the semiconductor chip S.

The points of difference between this semiconductor chip S and the semiconductor chip S illustrated in FIG. 11 are that the light incidence face of the substrate has a undulations, as illustrated in FIG. 10, and high concentration impurity regions 1N for controlling cross-talk are formed in the thick regions TK. The thin portions TN according to this example are formed by creating a lattice-shaped mask on either face of the substrate and then using this mask to perform etching of the substrate.

The centres of the apertures of the mask are aligned with a line extending in the thickness direction of the substrate. The depressions formed by etching are narrower at the base. Consequently, when the substrate is etched on either side thereof, a merit is obtained in that the surface area of the base portion of the depression can be increased, compared to a case where etching is performed on one side only. In this semiconductor chip S, since photodiodes are formed in the thin portions, the traveling distance of the carrier generated in response to light incidence becomes short, thereby the present device can obtain a high sensitivity, a high speed response and a low crosstalk between the pixels.

What is claimed is:

1. A detector comprising:
    a semiconductor chip formed with a plurality of photodetector elements and provided with a plurality of output terminals of said photodetector elements on a surface thereof,
    a circuit substrate provided with a plurality of input terminals to which signals from said output terminals are input, and
    connecting means for connecting said respective output terminals to said respective input terminals;
    wherein the interval between said input terminals is set to a smaller dimension than the interval between said output terminals,
    wherein said circuit substrate comprises a signal reading circuit for reading out signals from said input terminals, said signal reading circuit being provided in a region outside the region in which said input terminals are formed such that none of said input terminals is located directly above or directly below said signal reading circuit, and
    wherein a plurality of first metal wires for connection to external leads are electrically connected to said circuit substrate and arranged outside the region where the input terminals are formed such that none of said input terminals is located directly above or directly below said first metal wires.

2. The detector according to claim 1, wherein said connecting means also provides an electrical connection of said circuit substrate to said external leads, and wherein said electrical connection comprises said plurality of first metal wires.

3. The detector according to claim 1, wherein said connecting means constitutes a supporting substrate for said semiconductor chip.

4. The detector according to claim 3, wherein said supporting substrate has a depression for accommodating said circuit substrate.

5. The detector according to claim 3, wherein said connecting means is formed by burying metal wiring, inside a ceramic base member, said metal wiring being connected to said output terminals and said input terminals.

6. The detector according to claim 1, further comprising a scintillator formed on the light receiving side of said semiconductor chip.

7. The detector according to claim 1, wherein said connecting means is constituted by a multiple-layer wiring substrate, said output terminals of said semiconductor chip and one face of said multiple-layer wiring substrate being connected by means of bumps, and the other face of said multiple-layer wiring substrate and said input terminals of said circuit substrate being connected by means of bumps.

8. The detector according to claim 1, wherein said connecting means is constituted by thin film multiple-layer wiring formed on one face of said semiconductor chip, said thin film multiple-layer wiring and said input terminals of said circuit substrate being connected by means of bumps.

9. A detector according to claim 1, wherein the thickness of said semiconductor chip is 50–100 μm.

10. A detector according to claim 1, wherein the light incident surface of said semiconductor chip has a plurality of depressions.

11. A detector according to claim 1, wherein a surface of said semiconductor chip opposite to the light incident surface of said semiconductor chip has a plurality of depressions.

12. A detector according to claim 1, wherein the light incident surface of said semiconductor chip, as well as a surface of said semiconductor chip opposite to the light incident surface each have a plurality of depressions.

13. A detector according to claim 1, wherein a second set of metal wires are buried in a through hole which passes through the thickness of said semiconductor chip, said second metal wires connecting the photodetector elements with the output terminals.

14. A detector comprising:
a semiconductor chip on which a plurality of photodetector elements are formed,
a circuit substrate to which output signal from said semiconductor chip are input, and
a supporting substrate for supporting said semiconductor chip and said circuit substrate,
wherein the dimensions of said supporting substrate in the direction perpendicular to the thickness direction thereof are equal to or less than the dimensions of said semiconductor chip in the direction perpendicular to the thickness direction thereof,
wherein metal wires are formed inside said supporting substrate, said metal wires connecting the photodetector elements and the circuit substrate, the ends of said metal wires forming input terminals of said circuit substrate, the input terminals being positioned at a central region of the circuit substrate, and
wherein a plurality of other metal wires are electrically connected to said circuit substrate and arranged outside the region where the input terminals are formed such that none of the input terminals is located directly above or directly below said other metal wires.

15. The detector according to claim 14, wherein said supporting substrate constitutes a portion of a package for accommodating said circuit substrate.

16. The detector according to claim 15, wherein the dimensions of said circuit substrate in the direction perpendicular to the thickness direction thereof are less than the dimensions of said semiconductor chip in the direction perpendicular to the thickness direction thereof.

17. A detector according to claim 14, wherein the thickness of said semiconductor chip is 50–100 μm.

18. A detector according to claim 14, wherein the light incident surface of said semiconductor chip has a plurality of depressions.

19. A detector according to claim 14, wherein a surface of said semiconductor chip opposite to the light incident surface of said semiconductor chip has a plurality of depressions.

20. A detector according to claim 14, wherein the light incident surface of said semiconductor chip, as well as a surface of said semiconductor chip opposite to the light incident surface each have a plurality of depressions.

21. A detector according to claim 14, wherein a second set of metal wires are buried in a through hole which passes through the thickness of said semiconductor chip, said second metal wires connecting the photodetector elements with said metal wires formed inside said supporting substrate.

22. A detector comprising:
a semiconductor chip formed with a plurality of photodetector elements,
a circuit substrate to which all the output signals of said semiconductor chip are input, and
a supporting substrate for supporting said semiconductor chip and said circuit substrate,
wherein the dimensions of said circuit substrate in the direction perpendicular to the thickness direction thereof are less than the dimensions of said semiconductor chip in the direction perpendicular to the thickness direction thereof,
wherein metal wires are formed inside said supporting substrate, said metal wires connecting the photodetector elements and the circuit substrate, the ends of said metal wires forming input terminals of said circuit substrate, the input terminals being positioned at a central region of the circuit substrate, and
wherein a plurality of other metal wires are electrically connected to said circuit substrate and arranged outside the region where the input terminals are formed such that none of the input terminals is located directly above or directly below said other metal wires.

23. A detector according to claim 22, wherein the thickness of said semiconductor chip is 50–100 μm.

24. A detector according to claim 22, wherein the light incident surface of said semiconductor chip has a plurality of depressions.

25. A detector according to claim 22, wherein a surface of said semiconductor chip opposite to the light incident surface of said semiconductor chip has a plurality of depressions.

26. A detector according to claim 22, wherein the light incident surface of said semiconductor chip, as well as a surface of said semiconductor chip opposite to the light incident surface each have a plurality of depressions.

27. A detector according to claim 22, wherein a second set of metal wires are buried in a through hole which passes through the thickness of said semiconductor chip, said second metal wires connecting the photodetector elements with said metal wires formed inside said supporting substrate.

28. A detector comprising:
a semiconductor chip formed with a plurality of photodetector elements and provided with a plurality of output terminals of said photodetector elements on the surface thereof,
a circuit substrate provided with a plurality of input terminals to which signals from said output terminals are input, and
a supporting substrate that connects said respective output terminals to said respective input terminals,
wherein the interval between said input terminals is set to a smaller dimension than the interval between said output terminals,
said circuit substrate includes a signal reading circuit for reading out signals from said input terminals, said signal reading circuit being provided in a region outside of the region in which said input terminals are formed such that none of said input terminals is located directly above or directly below said signal reading circuit, and
wherein a plurality of metal wires are electrically connected to said circuit substrate and arranged outside the region where the input terminals are formed such that none of said input terminals is located directly above or directly below said metal wires.

29. A detector according to claim 28, wherein the thickness of said semiconductor chip is 50–100 μm.

30. A detector according to claim 28, wherein the light incident surface of said semiconductor chip has a plurality of depressions.

31. A detector according to claim 28, wherein a surface of said semiconductor chip opposite to the light incident surface of said semiconductor chip has a plurality of depressions.

32. A detector according to claim 28, wherein the light incident surface of said semiconductor chip, as well as a surface of said semiconductor chip opposite to the light incident surface each have a plurality of depressions.

33. A detector according to claim 28, wherein a second set of metal wires are buried in a through hole which passes through the thickness of said semiconductor chip, said second metal wires connecting the photodetector elements with the metal wires in said supporting substrate.

34. A detector comprising:
a semiconductor chip on which a plurality of photodetector elements are formed,
a circuit substrate to which output signals from said semiconductor chip are input, and
a supporting substrate for supporting said semiconductor chip and said circuit substrate,
wherein the dimensions of said supporting substrate in the direction perpendicular to the thickness direction thereof are equal to or less than the dimensions of said semiconductor chip in the direction perpendicular to the thickness direction thereof,
wherein metal wires are formed inside said supporting substrate, said metal wires connecting the photodetector elements and the circuit substrate, the ends of said metal wires forming input terminals of said circuit substrate, said metal wires being bunched together toward said circuit substrate, and
wherein a plurality of other metal wires are electrically connected to said circuit substrate and arranged outside the region where the input terminals are formed such that none of the input terminals is located directly above or directly below said other metal wires.

35. A detector according to claim 34, wherein the thickness of said semiconductor chip is 50–100 μm.

36. A detector according to claim 34, wherein the light incident surface of said semiconductor chip has a plurality of depressions.

37. A detector according to claim 34, wherein a surface of said semiconductor chip opposite to the light incident surface of said semiconductor chip has a plurality of depressions.

38. A detector according to claim 34, wherein the light incident surface of said semiconductor chip, as well as a surface of said semiconductor chip opposite to the light incident surface each have a plurality of depressions.

39. A detector according to claim 34, wherein a second set of metal wires are buried in a through hole which passes through the thickness of said semiconductor chip, said second metal wires connecting the photodetector elements with said metal wires formed inside said supporting substrate.

40. A detector comprising:
a semiconductor chip on which a plurality of photodetector elements are formed,
a circuit substrate to which output signal from said semiconductor chip are input, and
a supporting substrate for supporting said semiconductor chip and said circuit substrate,
wherein the dimensions of said supporting substrate in the direction perpendicular to the thickness direction thereof are equal to or less than the dimensions of said semiconductor chip in the direction perpendicular to the thickness direction thereof,
wherein metal wires are formed inside said supporting substrate, said metal wires connecting the photodetector elements and the circuit substrate, the ends of said metal wires forming input terminals of said circuit substrate, and the other ends of said metal wires forming output terminals of said photodetector elements, the intervals of the input terminals being narrower than the intervals of the output terminals, and
wherein a plurality of other metal wires are electrically connected to said circuit substrate and arranged outside the region where the input terminals are formed such that none of the input terminals is located directly above or directly below said other metal wires.

41. A detector according to claim 40, wherein the thickness of said semiconductor chip is 50–100 μm.

42. A detector according to claim 40, wherein the light incident surface of said semiconductor chip has a plurality of depressions.

43. A detector according to claim 40, wherein a surface of said semiconductor chip opposite to the light incident surface of said semiconductor chip has a plurality of depressions.

44. A detector according to claim 40, wherein the light incident surface of said semiconductor chip, as well as a surface of said semiconductor chip opposite to the light incident surface each have a plurality of depressions.

45. A detector according to claim 40, wherein a second set of metal wires are buried in a through hole which passes through the thickness of said semiconductor chip, said second metal wires connecting the photodetector elements with said metal wires formed inside said supporting substrate.

46. A detector comprising:
a semiconductor chip formed with a plurality of photodetector elements,
a circuit substrate to which all the output signals of said semiconductor chip are input, and
a supporting substrate for supporting said semiconductor chip and said circuit substrate,
wherein the dimensions of said circuit substrate in the direction perpendicular to the thickness direction thereof are less than the dimensions of said semiconductor chip in the direction perpendicular to the thickness direction thereof,
wherein metal wires are formed inside said supporting substrate, said metal wires connecting the photodetector elements and the circuit substrate, the ends of said metal wires forming input terminals of said circuit substrate, said metal wires being bunched together toward said circuit substrate, and
wherein a plurality of other metal wires are electrically connected to said circuit substrate and arranged outside the region where the input terminals are formed such that none of the input terminals is located directly above or directly below said other metal wires.

47. A detector according to claim 46, wherein the thickness of said semiconductor chip is 50–100 μm.

48. A detector according to claim 46, wherein the light incident surface of said semiconductor chip has a plurality of depressions.

49. A detector according to claim 46, wherein a surface of said semiconductor chip opposite to the light incident surface of said semiconductor chip has a plurality of depressions.

50. A detector according to claim 46, wherein the light incident surface of said semiconductor chip, as well as a surface of said semiconductor chip opposite to the light incident surface each have a plurality of depressions.

51. A detector according to claim 46, wherein a second set of metal wires are buried in a through hole which passes through the thickness of said semiconductor chip, said second metal wires connecting the photodetector elements with said metal wires formed inside said supporting substrate.

52. A detector comprising:
a semiconductor chip formed with a plurality of photodetector elements,
a circuit substrate to which all the output signals of said semiconductor chip are input, and
a supporting substrate for supporting said semiconductor chip and said circuit substrate,
wherein the dimensions of said circuit substrate in the direction perpendicular to the thickness direction thereof are less than the dimensions of said semiconductor chip in the direction perpendicular to the thickness direction thereof, and
wherein metal wires are formed inside said supporting substrate, said metal wires connecting the photodetector elements and the circuit substrate, the ends of said metal wires forming input terminals of said circuit substrate, and the other ends of said metal wires forming output terminals of said photodetector elements, the intervals of the input terminals being narrower than the intervals of the output terminals, and
wherein a plurality of other metal wires are electrically connected to said circuit substrate and arranged outside the region where the input terminals are formed such that none of the input terminals is located directly above or directly below said other metal wires.

53. A detector according to claim 52, wherein the thickness of said semiconductor chip is 50–100 μm.

54. A detector according to claim 52, wherein the light incident surface of said semiconductor chip has a plurality of depressions.

55. A detector according to claim 52, wherein a surface of said semiconductor chip opposite to the light incident surface of said semiconductor chip has a plurality of depressions.

56. A detector according to claim 52, wherein the light incident surface of said semiconductor chip, as well as a surface of said semiconductor chip opposite to the light incident surface each have a plurality of depressions.

57. A detector according to claim 52, wherein a second set of metal wires are buried in a through hole which passes through the thickness of said semiconductor chip, said second metal wires connecting the photodetector elements with said metal wires formed inside said supporting substrate.

58. A detector comprising:
a semiconductor chip on which a plurality of photodetector elements are formed;
a circuit substrate to which output signals from said semiconductor chip are input;
metal wires arranged inside a member, being bunched together toward said circuit substrate so as to electrically connect said photodetector elements to said circuit substrate, the ends of said metal wires forming the input terminals of said circuit substrate, and
a supporting substrate having a surface facing said member, a region where said input terminals is formed being surrounded by a peripheral section including said surface of said supporting substrate.

59. A detector according to claim 58, wherein a plurality of other metal wires are electrically connected to said circuit substrate and buried in a peripheral section of said supporting substrate.

60. A detector comprising:
a semiconductor chip on which a plurality of photodetector elements are formed, having output terminals for the photodetector elements;
a circuit substrate having input terminals to which output signals from said semiconductor chip are input, said circuit substrate comprising a signal reading circuit connected to said input terminals and arranged in a region outside the input terminals; and
connecting means for connecting said input terminals and said output terminals, the interval between said input terminals being set to a smaller dimension than the interval between said output terminals,
wherein said circuit substrate is arranged inside said connecting means with sides of said circuit substrate being surrounded by a peripheral portion of said connecting means, and
wherein said connecting means has buried metal wires connecting said circuit substrate to an external location, said circuit substrate being arranged between said buried metal wires with said buried metal wires being buried within said peripheral portion of said connecting means.

61. A detector comprising:
a semiconductor chip on which a plurality of photodetector elements are formed, having output terminals for the photodetector elements;
a circuit substrate having input terminals to which output signals from said semiconductor chip are input, said circuit substrate comprising a signal reading circuit connected to said input terminals and arranged in a region outside the input terminals;

connecting means for connecting said input terminals and said output terminals; and a supporting substrate for supporting said circuit substrate and said connecting means, wherein each of the dimensions of said circuit substrate and said connecting means in the direction perpendicular to the thickness direction thereof is equal to or less than the dimension of said semiconductor chip in the direction perpendicular to the thickness direction thereof, wherein said circuit substrate is arranged inside said supporting substrate with sides of said circuit substrate being surrounded by a peripheral portion of said supporting substrate, and wherein said supporting substrate has buried metal wires connecting said circuit substrate to an external location, said circuit substrate being arranged between said buried metal wires with said buried metal wires being buried within said peripheral portion of said supporting substrate.

62. A detector comprising:

a semiconductor chip on which a plurality of photodetector elements are formed, having output terminals for the photodetector elements;

a circuit substrate having input terminals to which output signals from said semiconductor chip are input, said circuit substrate comprising a signal reading circuit connected to said input terminals and arranged in a region outside the input terminals;

connecting means for connecting said input terminals and said output terminals by wires that are bunched together toward said circuit substrate; and a supporting substrate for supporting said circuit substrate and said connecting means, wherein each of the dimensions of said circuit substrate and said connecting means in the direction perpendicular to the thickness direction thereof is equal to or less than the dimension of said semiconductor chip in the direction perpendicular to the thickness direction thereof, wherein said circuit is arranged inside said supporting substrate with sides of said circuit substrate being surrounded by a peripheral portion of said supporting substrate, wherein said supporting substrate has buried metal wires connecting said circuit substrate to an external location, said circuit substrate being arranged between said buried metal wires with said buried metal wires being buried within said peripheral portion of said supporting substrate, wherein said connecting means and said supporting substrate are connected by first bumps, and wherein said semiconductor chip and said connecting means are connected by bumps having a higher melting point than the first bumps.

* * * * *